United States Patent
Luo et al.

(10) Patent No.: US 9,329,211 B2
(45) Date of Patent: *May 3, 2016

(54) SYSTEM AND METHOD OF MEASURING REAL-TIME CURRENT

(71) Applicant: Dell Products L.P., Round Rock, TX (US)

(72) Inventors: Shiguo Luo, Austin, TX (US); Ralph H. Johnson, III, Round Rock, TX (US); James L. Petivan, III, Austin, TX (US); Hang Li, Austin, TX (US)

(73) Assignee: Dell Products L.P., Round Rock, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/802,858

(22) Filed: Jul. 17, 2015

(65) Prior Publication Data
US 2015/0323572 A1 Nov. 12, 2015

Related U.S. Application Data

(63) Continuation of application No. 13/787,080, filed on Mar. 6, 2013, now Pat. No. 9,122,472.

(51) Int. Cl.
| | |
|---|---|
| *G01R 19/25* | (2006.01) |
| *G01R 35/00* | (2006.01) |
| *G06F 1/28* | (2006.01) |
| *G01R 31/40* | (2014.01) |
| *G01R 19/00* | (2006.01) |

(52) U.S. Cl.
CPC ............ *G01R 19/2513* (2013.01); *G01R 31/40* (2013.01); *G01R 35/005* (2013.01); *G06F 1/28* (2013.01); *G01R 19/003* (2013.01); *G01R 19/25* (2013.01)

(58) Field of Classification Search
CPC ....... H01Q 3/34; H01Q 3/26; G01R 19/0092; G01R 27/14; H01M 10/44; H01M 10/48
USPC .................... 324/72, 130, 433, 522, 713, 120; 320/142, 151, 156
See application file for complete search history.

(56) References Cited

U.S. PATENT DOCUMENTS

| | | | |
|---|---|---|---|
| 2008/0303506 A1* | 12/2008 | Chen ................. | G01R 19/1659 324/72 |
| 2010/0072956 A1 | 3/2010 | Fiebrich et al. | |

* cited by examiner

*Primary Examiner* — Patrick Assouad
*Assistant Examiner* — Taqi Nasir
(74) *Attorney, Agent, or Firm* — Baker Botts L.L.P.

(57) ABSTRACT

A system and method of measuring real-time current is disclosed. The method includes calibrating a voltage measurement device. Calibrating includes measuring a real-time voltage difference between a first measurement node located proximate a first connector on a motherboard and a second measurement node located proximate a second connector on a power supply unit (PSU), the first and the second connectors coupled to provide power to the motherboard. Calibrating further includes averaging the real-time voltage difference for a plurality of measurements; computing a resistance of the coupling based at least on a long-duration averaged current from the PSU and the averaged real-time voltage difference, the resistance varying over time; and reporting the resistance of the coupling to the voltage measurement device. The method also includes measuring a real-time current of the PSU at the voltage measurement device based at least on the resistance of the coupling and the real-time voltage difference.

20 Claims, 4 Drawing Sheets

SYSTEM AND METHOD OF MEASURING REAL-TIME CURRENT

RELATED APPLICATIONS

This application is a continuation of pending U.S. patent application Ser. No. 13/787,080 filed Mar. 6, 2013, the contents of which is incorporated herein in its entirety by this reference.

TECHNICAL FIELD

The present disclosure relates generally to information handling systems, and more particularly to measuring real-time current of a power supply associated with an information handling system.

BACKGROUND

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

As processors, graphics cards, random access memory (RAM) and other components in information handling systems have increased in clock speed and power consumption, the amount of current required for these components has increased. However, excessive current draw may damage components of an information handling system. It may be desirable to measure the current being drawn from a power supply to power components of the information handling system. Some attempts to measure current may use sense components, but this may result in a substantial power loss. Some attempts may use attempts to measure at the power supply, but this may be very costly to implement or very slow.

SUMMARY

In one embodiment, a method is described including calibrating a voltage measurement device. Calibrating the voltage measurement device includes measuring a real-time voltage difference between a first measurement node located proximate a first connector on a motherboard and a second measurement node located proximate a second connector on a power supply unit (PSU), the first and the second connectors coupled to provide power to the motherboard. Calibrating the voltage measurement device further includes averaging the real-time voltage difference for a plurality of measurements, computing a resistance of the coupling between the first and the second connectors based at least on a long-duration averaged current from the PSU and the averaged real-time voltage difference, the resistance varying over time, and reporting the resistance of the coupling to the voltage measurement device. The method also includes measuring a real-time current of the PSU at the voltage measurement device based at least on the resistance of the coupling and the real-time voltage difference.

In another embodiment, an information handling system is disclosed. The information handling system includes a motherboard comprising a first connector for coupling to another connector and a first measurement node positioned proximate the first connector on the motherboard. The information handling system also includes a power supply unit (PSU) comprising a second connector coupled to and supplying power to the motherboard via the first connector, the coupling of the first and the second connectors having a resistance that varies over time, and a second measurement node positioned proximate the second connector on the PSU. The information handling system further includes a voltage measurement device configured to measure a real-time voltage difference between the first measurement node and the second measurement node and measure a real-time current of the PSU based at least on the real-time voltage difference between the first and the second measurement nodes and the resistance of the coupling. The information handling system also includes a calibrating device configured to calibrate the voltage measurement device. The calibrating device is further configured to receive a long-duration averaged current from the PSU, average the measured real-time voltage difference between the first and the second measurement nodes at a plurality of time increments, compute the resistance of the coupling based at least on the averaged measured real-time voltage and the long-duration averaged current, and report the resistance of the coupling to the voltage measurement device.

In a further embodiment, an information handling system is disclosed. The information handling system includes a motherboard comprising a first connector for coupling to another connector and a first measurement node positioned proximate the first connector on the motherboard. The information handling system also includes a power supply unit (PSU) comprising a second connector coupled to and supplying power to the motherboard via the first connector, the coupling of the first and the second connectors having a resistance that varies over time, and a second measurement node positioned proximate the second connector on the PSU. The information handling system further includes a voltage measurement device configured to measure a real-time voltage difference between the first measurement node and the second measurement node. The information handling system also includes a trip point detector configured to receive and retain a trip point voltage, receive the real-time voltage difference from the voltage measurement device, compare the trip point voltage to the real-time voltage difference, and generate a signal based on the real-time voltage difference exceeding the trip point voltage. The information handling system further includes a calibrating device configured to generate the trip point voltage. The calibrating device is further configured to receive a long-duration averaged current from the PSU, average the measured real-time voltage difference between the first and the second measurement nodes for a plurality of measurements, compute the resistance of the coupling based at least on the averaged measured real-time voltage and the long-duration averaged current, and update the trip point voltage based at least on the computed resistance of the coupling.

BRIEF DESCRIPTION OF THE DRAWINGS

A more complete understanding of the disclosed embodiments and advantages thereof may be acquired by referring to the following description taken in conjunction with the accompanying drawings, in which like reference numbers indicate like features, and wherein.

DETAILED DESCRIPTION

Preferred embodiments and their advantages are best understood by reference to FIGS. 1-5, wherein like numbers are used to indicate like and corresponding parts.

For the purposes of this disclosure, an information handling system may include any instrumentality or aggregate of instrumentalities operable to compute, calculate, determine, classify, process, transmit, receive, retrieve, originate, switch, store, display, communicate, manifest, detect, record, reproduce, handle, or utilize any form of information, intelligence, or data for business, scientific, control, or other purposes. For example, an information handling system may be a personal computer (e.g., desktop or laptop), tablet computer, mobile device (e.g., personal digital assistant (PDA) or smart phone), server (e.g., blade server or rack server), a network storage device, or any other suitable device and may vary in size, shape, performance, functionality, and price. The information handling system may include random access memory (RAM), one or more processing resources such as a central processing unit (CPU) or hardware or software control logic, ROM, and/or other types of nonvolatile memory. Additional components or the information handling system may include one or more disk drives, one or more network ports for communicating with external devices as well as various input and output (I/O) devices, such as a keyboard, a mouse, touchscreen and/or a video display. The information handling system may also include one or more buses operable to transmit communication between the various hardware components.

For the purposes of this disclosure, computer-readable media may include any instrumentality or aggregation of instrumentalities that may retain data and/or instructions for a period of time. Computer-readable media may include, without limitation, storage media such as a direct access storage device (e.g., a hard disk drive or floppy disk), a sequential access storage device (e.g., a tape disk drive), compact disk, CD-ROM, DVD, random access memory (RAM), read-only memory (ROM), electrically erasable programmable read-only memory (EEPROM), and/or flash memory; as well as communications media such as wires, optical fibers, microwaves, radio waves, and other electromagnetic and/or optical carriers; and/or any combination of the foregoing.

Figure 1:
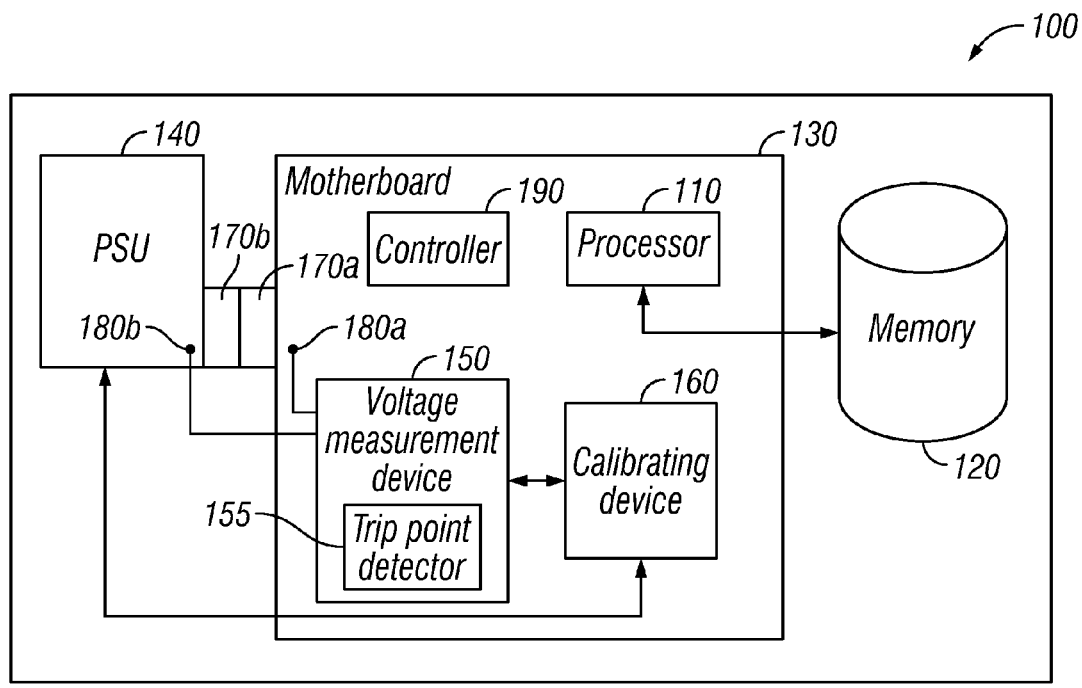
FIG. 1 illustrates a block diagram of an example information handling system, in accordance with the present disclosure.

FIG. 1 illustrates a block diagram of an example information handling system 100, in accordance with certain embodiments of the present disclosure. In certain embodiments, information handling system 100 may comprise a computer chassis or enclosure (e.g., a server chassis holding one or more server blades). In other embodiments, information handling system 100 may comprise a storage enclosure. In yet other embodiments, information handling system 100 may be a personal computer (e.g., a desktop computer or a portable computer). As depicted in FIG. 1, information handling system 100 may include a processor 110, a memory 120, a motherboard 130, a power supply unit (PSU) 140, a voltage measurement device 150, a calibrating device 160, a motherboard connector 170*a*, a power supply connector 170*b*, a motherboard measurement node 180*a*, and a power supply measurement node 180*b*. In some embodiments, voltage measurement device 150 may further include a trip point detector 155, or trip point detector 155 may be a stand-alone component. Information handling system 100 may also include a controller 190. Information handling system 100 may be configured to provide real-time measurement of current being delivered by PSU 140 to motherboard 130 by using Ohm's Law and measuring a voltage difference between the two measurement nodes 180*a* and 180*b* and knowing the resistance of the coupling between PSU 140 and motherboard 130. However, the resistance of the coupling may vary over time so calibrating device 160 may be configured to facilitate calibrating voltage measurement device 150 to provide accurate current readings Processor 110 may include any system, device, or apparatus configured to interpret and/or execute program instructions and/or process data, and may include, without limitation a microprocessor, microcontroller, digital signal processor (DSP), application specific integrated circuit (ASIC), or any other digital or analog circuitry configured to interpret and/or execute program instructions and/or process data. In some embodiments, processor 110 may interpret and/or execute program instructions and/or process data stored in memory 120 and/or another component of information handling system 100. Although FIG. 1 depicts information handling system 100 as including one processor 110, information handling system 100 may include any suitable number of processors 110.

Memory 120 may be communicatively coupled to processor 110 and may include any system, device, or apparatus configured to retain program instructions and/or data for a period of time (e.g., computer-readable media). Memory 120 may include random access memory (RAM), electrically erasable programmable read-only memory (EEPROM), a PCMCIA card, flash memory, magnetic storage, opto-magnetic storage, or any suitable selection and/or array of volatile or non-volatile memory that retains data after power to information handling system 100 is turned off. Although FIG. 1 depicts information handling system 100 as including one memory 120, information handling system 100 may include any suitable number and variety of memories 120.

Motherboard 130 may be any component or set of components configured to facilitate communication among and between components of information handling system 100. For example, motherboard 130 may include a printed circuit board with a variety of connectors thereon that various components of information handling system 100 may interface with. In some embodiments, motherboard 130 may have designated interfaces for any of processor 110, memory 120, PSU 140, voltage measurement device 150, calibrating device 160, controller 190, a graphics processing unit (GPU), a network interface card (NIC), or any combinations thereof. In some embodiments, motherboard 130 may distribute power from PSU 140 to other components of information handling system 100. For example, motherboard 130 may distribute power to one or more processors 110 of information handling system 100.

Motherboard connector 170a may be a connector configured to interface with PSU 140. In some embodiments, connector 170a may be a dedicated interface for exclusively connecting to one or more PSUs 140. For example, connector 170a may be a male or a female end of a connection pair. In other embodiments, connector 170a may be a generic connector of motherboard 130 that is capable of interfacing with any of a variety of components of information handling system 100, including PSU 140. In some embodiments, connector 170a may have features for receiving power from PSU 140 and other features for providing data communication with PSU 140. For example, connector 170a may have a series of wires or pins configured to receive data from or send data to PSU 140.

PSU 140 may be electrically coupled to various components of information handling system 100 and may include any device, system, or apparatus operable to supply electrical energy to one or more components of information handling system 100. Although FIG. 1 depicts information handling system 100 as including one PSU 140, information handling system 100 may include any suitable number of PSUs 140. As shown in FIG. 1, in some embodiments, PSU may directly supply electrical energy to motherboard 130, which may then distribute electrical energy to various other components of information handling system 100.

PSU 140 may be configured to provide a variety of default information and messages to components of information handling system 100. For example, in some embodiments, PSU 140 may slowly measure, average, and report the current flowing through PSU 140 over a long duration. This may occur on the order of seconds or tenths of seconds. For example, PSU 140 may report the current flowing through PSU 140 once per second. This may be represented by the variable $I_{long}$. Such slow reporting may be too slow for dynamic power management, to prevent PSU 140 shut down, or to prevent or mitigate damage to components of information handling system 100, including PSU 140.

Power supply connector 170b may be a connector configured to interface with motherboard 130. In some embodiments, connector 170b may be a dedicated interface for exclusively connecting to motherboard 130. For example, connector 170a may be a male or a female end of a connection pair. In other embodiments, connector 170b may be a generic connector that is capable of interfacing with any of a variety of components in information handling system 100. In some embodiments, connector 170b may have features for delivering power to motherboard 130 and other features for providing data communication with motherboard 130. For example, connector 170b may have a series of wires or pins configured to receive data from or send data to motherboard 130. In some embodiments, PSU 140 may report the long-duration averaged $I_{long}$ to motherboard 130 via connector 170b, or it may be sent to calibrating device 160 via some other communication channel. In some embodiments, motherboard 130 may then communicate $I_{long}$ to calibrating device 160.

Motherboard connector 170a and power supply connector 170b may be coupled to allow electrical power to flow from PSU 140 to motherboard 130. The coupling of the two connectors 170a and 170b may have a resistance associated with electrical current passing from PSU 140 to motherboard 130. This resistance may be represented by the variable $R_{couple}$. $R_{couple}$ may vary over time. For example, when information handling system 100 is first turned on, the ambient temperature within information handling system 100 may be relatively cool, such that connectors 170a and 170b may have a given resistance. As time progresses and components within information handling system 100 generate heat, connectors 170a and 170b may increase in temperature, thus varying the resistance of the coupling of the two connectors. For example, for most metals, as temperature increases, resistance increases based on a temperature coefficient of resistance or resistivity for the given material.

Voltage measurement device 150 may include any system, device, or apparatus configured to rapidly measure a voltage change between two points. For example, voltage measurement device 150 may include analog circuitry, digital circuitry, logic, or combination thereof configured to measure a voltage change between two points. In some embodiments, voltage measurement device 150 may also be configured to measure a current based on a measured voltage. For example, using Ohm's Law (I=V/R), with a known resistance between two points, voltage measurement device 150 may be able to measure a current between two points based on an observed voltage difference between the two points. It will be appreciated that the term voltage difference may include any relationship between two measurements of voltage, including an increase, a decrease, or equivalent values. Voltage measurement device 150 may be housed, attached, or configured to be part of motherboard 130, PSU 140, or may be a free-standing component. Voltage measurement device 150 may be configured to provide essentially instantaneous or real-time voltage difference measurements. For example, voltage measurement device 150 may provide real-time voltage measurements on the order of microseconds, for example, every 0.1, 1, 5, 10, 20, 50, or 100 microseconds.

In some embodiments, voltage measurement device 150 may be implemented as a voltmeter. When implemented as analog circuitry, voltage measurement device 150 may include op-amps, resistors, and/or capacitors configured such that the voltage difference between two points may be measured. When implemented as digital circuitry, voltage measurement device 150 may include front amps and analog to digital converters configured such that the voltage difference between two points may be measured. In some embodiments, either the analog or digital circuitry may be configured to amplify, filter, or both, the signal carrying a measurement.

Measurement nodes 180a and 180b may be any point from which voltage measurement device 150 may take voltage measurements. Measurement nodes may be a wire, a printed circuit, or any other feature or component able to carry a voltage signal. Measurement node 180a may be positioned proximate motherboard connector 170a on motherboard 130 such that voltage measurement device 150 may have one voltage measurement point just after electrical power is passed from PSU 140 to motherboard 130. Measurement node 180b may be positioned proximate power supply connector 170b such that voltage measurement device 150 may have a voltage measurement point just before electrical power is passed from PSU 140 to motherboard 130. In some embodiments, measurement nodes 180a and 180b may be associated with unused communication pins between PSU 140 and motherboard 130. In some embodiments, two current sense pins may be defined on power supply connector 170b such that sense signals from nodes 180a and 180b may be communicated to voltage measurement device 150 with limited or no power flowing impact regardless of where voltage measurement device 150 or calibrating device 160 may be located. In some embodiments this may include pins associated with connector 170a, 170b, or both. For example, if the combination of 170a and 170b is a male/female connection, there may be corresponding pin functionality on both 170a and 170b when they are coupled together.

Voltage measurement device 150 may be configured to take real-time measurements of the voltage difference between two points. For example, voltage measurement device 150 may take real-time measurements of the voltage difference between measurement nodes 180a and 180b. This may be represented by the variable $V_{real}$. This may correspond to the real-time voltage difference observed by passing the current from PSU 140 to motherboard 130. While voltage measurement device 150 may impart some resistance by measuring the voltage difference and thus draw a minimal current to take measurements, it will be appreciated that this resistance may be negligible when compared to the resistance from the coupling of motherboard connector 170a and power supply connector 170b. In some embodiments, the resistance from voltage measurement device 150 may be ignored when measuring the voltage difference between measurement nodes 180a and 180b. In other embodiments, the resistance of voltage measurement device 150 may be known and may be included in any analysis regarding voltage differences measured by voltage measurement device 150.

The minimal current from measurement nodes 180a and 180b may be passed along a data communication channel between PSU 140 and motherboard 130. For example, the data communication link between PSU 140 and motherboard 130 may carry the minimal current from node 180a to voltage measurement device 150 when voltage measurement device 150 is located on PSU 140. Alternatively, the data communication link may carry the minimal current from measurement node 180b when voltage measurement device 150 is located on motherboard 130. In some embodiments, this may be a dedicated pin of the data communication link between PSU 140 and motherboard 130.

Calibrating device 160 may include any system, device, or apparatus configured to calibrate voltage measurement device 150. Calibrating device 160 may include analog circuitry, digital circuitry, logic, software, hardware, or any combination thereof. Calibrating device 160 may be in communication with PSU 140 either directly or indirectly such that calibrating device 160 may receive the long-duration averaged current of PSU 140, $I_{long}$. Calibrating device 160 may also be in communication with voltage measurement device 150 such that calibrating device 160 may receive the real-time measurements of the voltage difference between measurement nodes 180a and 180b taken by voltage measurement device 150, $V_{real}$. Calibrating device 160 may average the real-time voltage difference $V_{real}$ for a plurality of time increments to determine an average voltage difference for a given time period. This may be represented by the variable $V_{avg}$. For example, calibrating device 160 may take a plurality of measurements from within the time span from which PSU 140 has reported the long-duration averaged current $I_{long}$. Alternatively, in some embodiments, calibrating device 160 may keep a rolling average of a certain number of real-time measurements of $V_{real}$ from voltage measurement device 150 to acquire $V_{avg}$ to correspond with the long-duration averaged current $I_{long}$ periodically reported by PSU 140.

Calibrating device 160 may be configured to compute $R_{couple}$ based on the long-duration averaged current $I_{long}$ reported by PSU 140 and the averaged real-time measurements of the voltage measured by voltage measurement device 150 $V_{avg}$. For example, using Ohm's Law, with a known current $I_{long}$ and an averaged voltage $V_{avg}$ known to correspond to that current, $R_{couple}$ may be computed. For example, $$R_{couple}=V_{avg}/I_{long}$$

Calibrating device 160 may then report this computed value of $R_{couple}$ to voltage measurement device 150. This may in turn enable voltage measurement device 150 to calculate in real-time the current flow coming from PSU 140 to motherboard 130 based on the known resistance $R_{couple}$. This may be represented by the variable $I_{real}$ and may be measured as described above.

As described above, $R_{couple}$ may be variable over time. Thus, in some embodiments, calibrating device 160 may continuously or periodically recalibrate voltage measurement device 150 by re-computing $R_{couple}$. For example, in some embodiments, calibrating device 160 may be configured to compare a rolling value of $V_{avg}$ to each reported value of $I_{long}$ to continuously compute $R_{couple}$. In alternative embodiments, calibrating device 160 may be configured to periodically sample the latest received or next arriving $I_{long}$ and compare it to a corresponding value of $V_{avg}$. For example, calibrating device 160 may periodically compute $R_{couple}$ every 0.5, 1, 1.5, 2, or 5 seconds, or any other frequency sufficient to guard against excessive changes to $R_{couple}$. Calibrating device 160 may be configured to only report $R_{couple}$ to voltage measurement device 150 if $R_{couple}$ has changed since the previous value of $R_{couple}$ reported to voltage measurement device 150.

In some embodiments, voltage measurement device 150 and calibrating device 160 may be part of PSU 140 rather than associated with motherboard 130. In such an embodiment, measurement nodes 180a and 180b may connect to voltage measurement device 150 on PSU 140 rather than to motherboard 130. Additionally, any computing or processing may be performed by a processor, logic or other feature of PSU 140, for example a PSU controller.

In some embodiments, information handling system 100 may additionally include a trip point detector 155. Trip point detector 155 may include any system, device, or apparatus configured to detect a trip point associated with measurements taken by voltage measurement device 150. Trip point detector 155 may include analog circuitry, digital circuitry, logic, software, hardware, or any combination thereof. For example, trip point detector 155 may be any comparator circuit like an op amp or a dedicated comparator chip. The trip point associated with trip point detector may be based on a voltage or a current. For example, trip point detector 155 may be configured to compare a trip point voltage to $V_{real}$. In other embodiments, trip point detector 155 may be configured to compare a trip point current to $I_{real}$. Trip point detector 155 may determine whether the measured value, for example $V_{real}$ or $I_{real}$ has exceeded the trip point. If the measured value has exceeded the trip point, trip point detector 155 may generate a signal indicating that this has occurred. This may be used by any of a variety of components within information handling system 100. For example, this may be used to initiate throttling of processor 110, generating a PROCHOT# signal, turning on another power supply, turning off or throttling other components, turning on or speeding up other components (like fans), notifying a user of information handling system 100, or any combinations thereof.

The trip point may be provided by any of a variety of components of information handling system 100. For example, trip point detector 155 may receive the trip point from processor 110, controller 190, voltage measurement device 150, calibrating device 160, or power supply 140.

In some embodiments, voltage measurement device 150 may include trip point detector 155. In other embodiments, trip point detector 155 may be a free standing component, or may be part of calibrating device 160. In some embodiments, the communication between voltage measurement device 150, trip point detector 155, and calibrating device 160 may be a closed loop system such that voltage measurement device 150 provides data to trip point detector 155 and calibrating device 160, and calibrating device 160 provides data to trip point detector 155 and/or voltage measurement device 150.

Controller 190 may include any system, device, or apparatus configured to interpret and/or execute program instructions and/or process data, and may include, without limitation a microprocessor, microcontroller, digital signal processor (DSP), application specific integrated circuit (ASIC), or any other digital or analog circuitry configured to interpret and/or execute program instructions and/or process data. In some embodiments, controller 190 may interpret and/or execute program instructions and/or process data stored in memory 120 and/or another component of information handling system 100. In certain embodiments, controller 190 may include or may be an integral part of a baseboard management controller (BMC), Dell Remote Access Controller (DRAC) or an Integrated Dell Remote Access Controller (iDRAC).

In some embodiments, controller 190 may be in communication with, cooperation with, control of, or an integral part of some or all of the components described herein. For example, in some embodiments, any of voltage measurement device 150, trip point detector 155, calibrating device 160, PSU 140, processor 110, memory 120 and combinations thereof may be configured to be controlled by or receive instructions from controller 190. In some embodiments, the functionality or features of one or all of voltage measurement device 150, trip point detector 155, and calibrating device 160 may be performed by controller 190. For example, in some embodiments, voltage measurement device 150, trip point detector 155, and calibrating device 160 may be an integral part of controller 190. In such an embodiment, the signal generated by trip point detector 155 may enable controller 190 to initiate any or all of the actions which may occur when a measured value exceeds the trip point.

Figure 2:
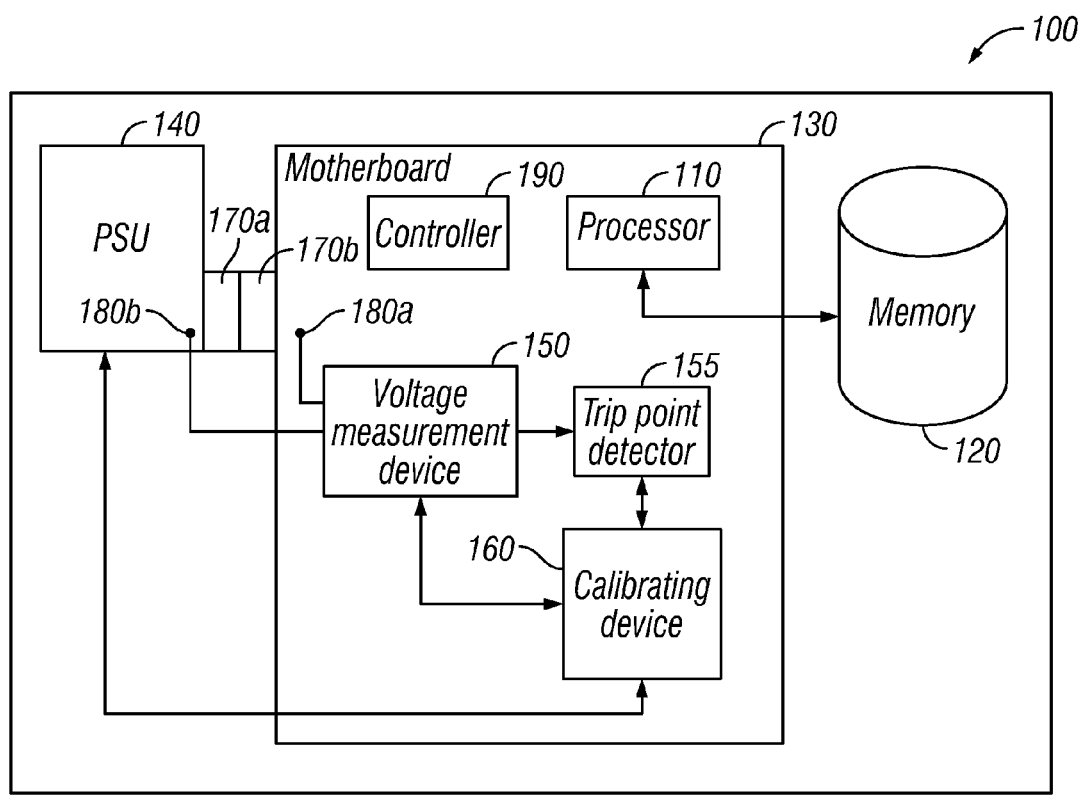
FIG. 2 illustrates a block diagram of an alternative example information handling system, in accordance with the present disclosure.

In an alternative embodiment shown in FIG. 2, voltage measurement device 150 may only measure the real-time voltage difference $V_{real}$ between measurement nodes 180a and 180b. In such an embodiment, trip point detector 155 may utilize a trip point voltage rather than a trip point current to determine whether a measured value has exceeded a given trip point or threshold. In such an embodiment, the calibration is also slightly modified. As described above, calibrating device 160 may compute $R_{couple}$ using $I_{long}$ and an averaged voltage $V_{avg}$. However, rather than reporting $R_{couple}$ to voltage measurement device 150, calibrating device 160 may use $R_{couple}$ to determine any changes to the trip point voltage. Thus, rather than voltage measurement device 150 solving for current using $R_{couple}$, calibrating device 160 would use changes in $R_{couple}$ to provide trip point detector 155 changes to the trip point voltage. For example, based on Ohm's Law, if $R_{couple}$ doubled in value, the value of the trip point voltage may be cut in half. In other words, the value of $R_{couple}$ may have an inverse relationship with the trip point value.

In such an embodiment, calibrating device 160 may be configured to use the received $V_{real}$ signal from voltage measurement device 150 to determine $I_{real}$. In some embodiments, voltage measurement device 150 may take an analog measurement, and simply pass the analog signal of the measured value $V_{real}$ to trip point detector 155. The analog signal from voltage measurement device 150 may also pass to an analog to digital converter to then pass a digital signal to calibrating device 160. Calibrating device 160 may then use the digital signal of $V_{real}$ to compute $R_{couple}$ and to measure $I_{real}$.

In some embodiments this may provide certain advantages over other attempts to measure current. For example, embodiments of the present disclosure may allow for faster measurement times (for example, twenty-five times faster) when compared to a general PSU inductor output reported to the system, which may only provide responses every 10-100 milliseconds. As another example, embodiments of the present disclosure may facilitate real-time current demands at the motherboard, which may provide a more accurate reading when compared to sense components that may not sense all components of a system. As a further example, embodiments of the present disclosure may provide an essentially lossless approach, in other words, almost no power may be used in measuring the current. As a final example, the cost both in power and money of using shunt resistors at a motherboard may be saved. These examples are in no way limiting, and merely serve as illustrations of some advantages of some embodiments of the present disclosure over other attempts to measure current.

Figure 3:
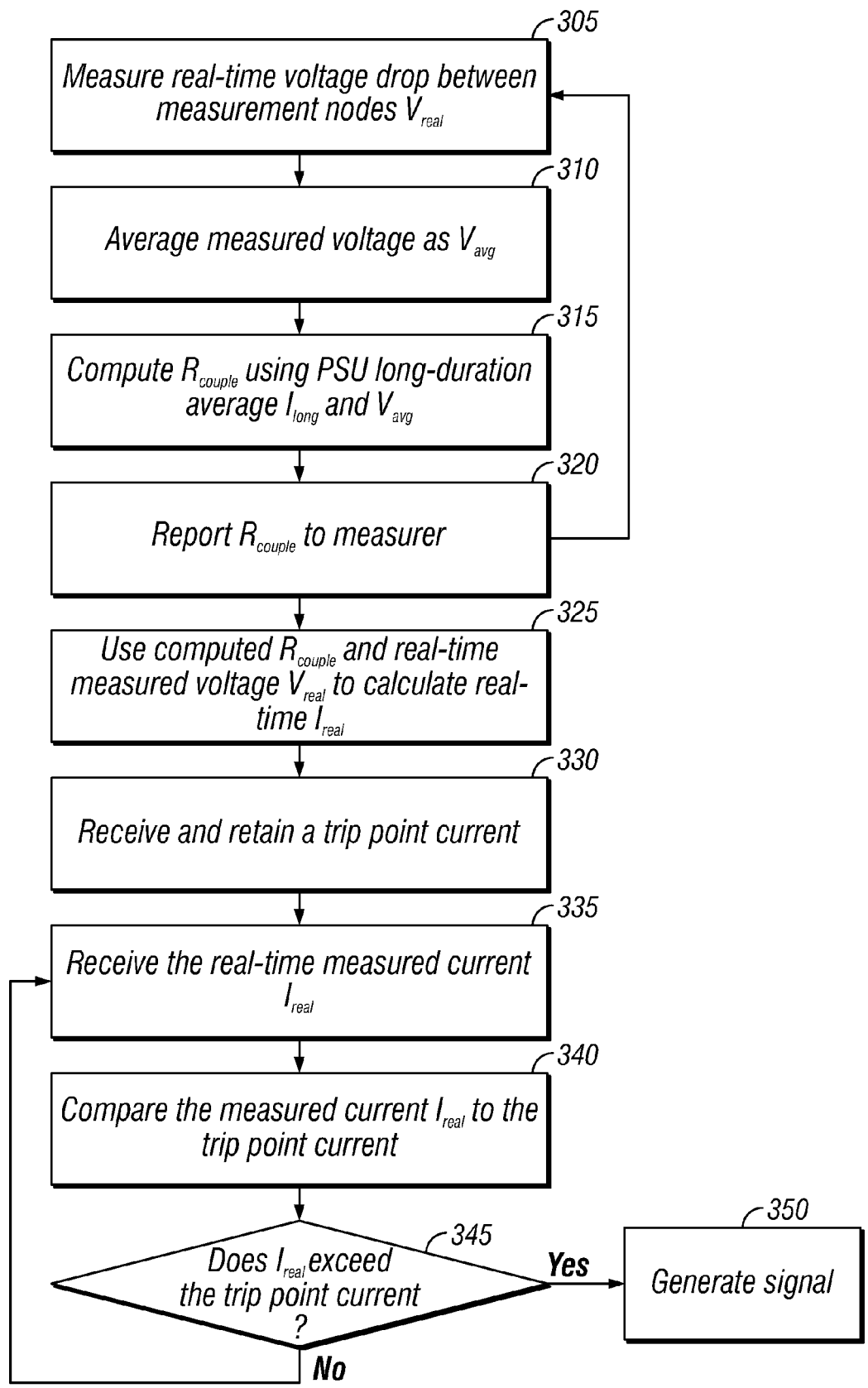
FIG. 3 illustrates an example of a set of operations to detect real-time current, in accordance with the present disclosure.

FIG. 3 illustrates an example of a set of operations to detect real-time current, in accordance with the present disclosure. As shown in FIG. 3, operation 305 may include measuring the real-time voltage difference between measurement nodes 180a and 180b, $V_{real}$. For example, voltage measurement device 150 may measure $V_{real}$. Operation 310 may include averaging the measured real-time voltage $V_{real}$ to acquire $V_{avg}$. This may include voltage measurement device 150 sending $V_{real}$ to calibrating device 160, which may average a plurality of measurements $V_{real}$ to acquire $V_{avg}$. Operation 315 may include computing $R_{couple}$ based at least on $I_{long}$ and voltage $V_{avg}$. For example, calibrating device 160 may receive $I_{long}$ from PSU 140 and then use $I_{long}$ and voltage $V_{avg}$ to compute $R_{couple}$. Operation 320 may include reporting the computed value of $R_{couple}$ by calibrating device 160 to voltage measurement device 150. In some embodiments, operations 305, 310, 315, and 320 may be continuously or periodically repeated so as to update the value of $R_{couple}$, as $R_{couple}$ may vary over time. Calibrating a voltage measurement device may be associated with operations 305, 310, 315, and 320.

Operation 325 may include using the computed value of $R_{couple}$ and real-time measure voltage to calculate real-time current, $I_{real}$.

Operation 330 may include receiving and retaining a trip point. For example, this may include processor 110 or controller 190 sending trip point detector 155 a trip point current value. Operation 335 may include receiving the real-time measured current $I_{real}$. For example, this may include trip point detector 155 receiving the real-time measured current $I_{real}$ from voltage measurement device 150. Operation 340 may include comparing the measured real-time current $I_{real}$ to the trip point. At decision 345, it may be determined whether $I_{real}$ exceeds the trip point. If not, the process may return to operation 335. If it is determined that the measured real-time current $I_{real}$ exceeds the trip point, operation 350 may include trip point detector 155 generating a signal indicating this has occurred.

Figure 4:
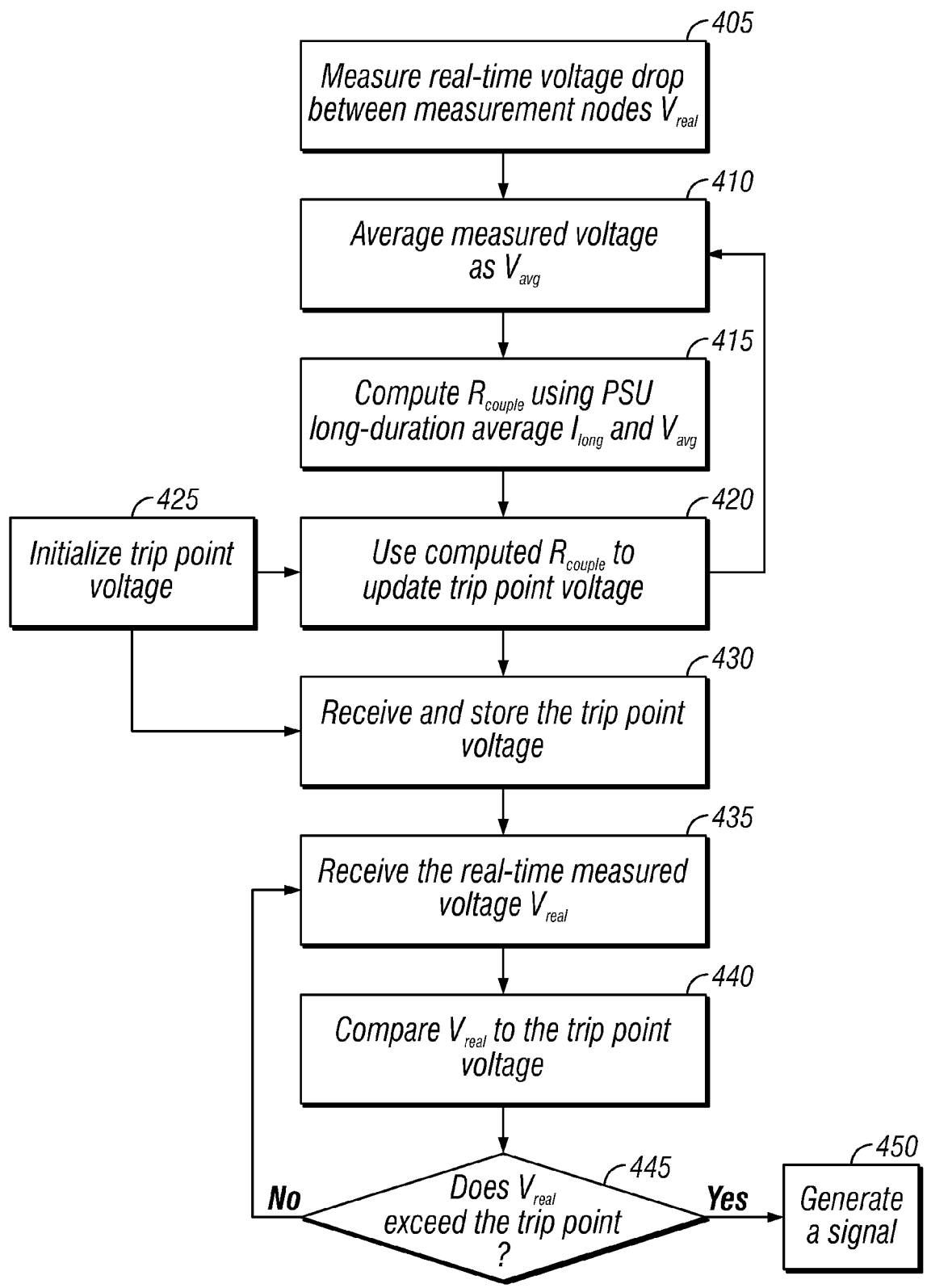
FIG. 4 illustrates an alternative example of a set of operations to detect real-time current, in accordance with the present disclosure.

FIG. 4 illustrates an alternative example of a set of operations to detect real-time current, in accordance with the present disclosure. As shown in FIG. 4, operation 405 may include measuring the real-time voltage difference between measurement nodes 180a and 180b, $V_{real}$. For example, voltage measurement device 150 may measure $V_{real}$. Operation 410 may include averaging the measured real-time voltage $V_{real}$ to acquire $V_{avg}$. This may include voltage measurement device 150 sending $V_{real}$ to calibrating device 160, which may average a plurality of measurements $V_{real}$ to acquire $V_{avg}$. Operation 415 may include computing $R_{couple}$ based at least on $I_{long}$ and voltage $V_{avg}$. For example, calibrating device 160 may receive $I_{long}$ from PSU 140 and then use $I_{long}$ and voltage $V_{avg}$ to compute $R_{couple}$. Operation 420 may using the computed value of $R_{couple}$ to update the trip point voltage include by calibrating device 160. In some embodiments, operations 405, 410, 415, and 420 may be continuously or periodically repeated so as to update the value of $R_{couple}$, as $R_{couple}$ may vary over time. Determining $R_{couple}$ may include operations 405, 410, 415, and 420.

Operation 425 may include initializing the trip point voltage. This may be used by calibrating device 160 as a baseline from which to update based on variations in $R_{couple}$. This may also be used by trip point detector 155 as an initial trip point for comparison. This may be generated by any of processor 110, controller 190, calibrating device 160, or PSU 140. For example, processor 110 may read the initial trip point value from memory 120 and send that value to calibrating device 160 and trip point detector 155.

Operation 430 may include receiving and storing a trip point. For example, this may include processor 110 or controller 190 sending trip point detector 155 an initial trip point voltage value. Alternatively, this may include calibrating device 160 sending trip point detector 155 an updated trip point based on variations in $R_{couple}$. Operation 435 may include receiving the real-time measured voltage $V_{real}$. For example, this may include trip point detector 155 receiving the real-time measured voltage $V_{real}$ from voltage measurement device 150. Operation 440 may include comparing the measured real-time voltage $V_{real}$ to the trip point. At decision 445, it may be determined whether $V_{real}$ exceeds the trip point. If not, the process may proceed back to operation 435. If it is determined that the measured real-time voltage $V_{real}$ exceeds the trip point, at operation 450 trip point detector 155 may generate a signal indicating this has occurred. Any of the resulting consequences of the signal may be expected as described above. Detecting a trip point may include operations 430, 435, 440, 445, and 450.

Figure 5:
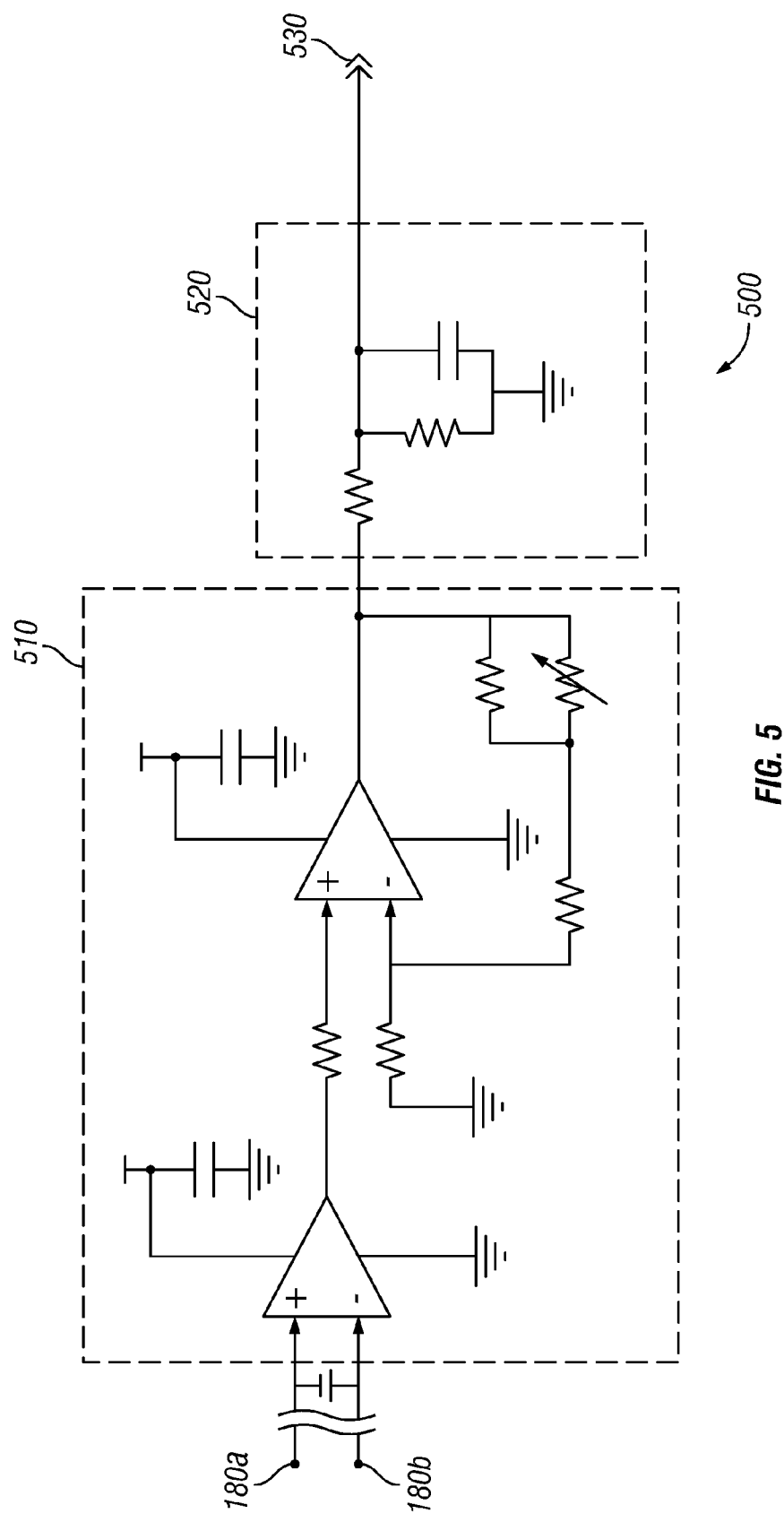
FIG. 5 illustrates an example embodiment of analog circuitry, in accordance with the present disclosure.

FIG. 5 illustrates an example embodiment of analog circuitry 500 in accordance with some embodiments of the present disclosure. As will be appreciated, the circuitry shown in FIG. 5 is merely an example and is in no way limiting. As shown in FIG. 5, analog circuitry 500 may include measurement nodes 180a and 180b. Analog circuitry 500 may further include region 510 configured to measure the voltage, amplify the signal, and compensate for temperature variations. Analog circuitry 500 may further include region 520 configured to average and filter the signal. The outgoing signal may be passed along line 530 to be used by a PSU, a motherboard, or some other system component.

Although the present disclosure has been described in detail, it should be understood that various changes, substitutions, and alterations can be made hereto without departing from the spirit and the scope of the disclosure as defined by the appended claims.

What is claimed is:

1. A method comprising:
   measuring a real-time voltage difference between a first measurement node located proximate a first connector on a motherboard and a second measurement node located proximate a second connector on a power supply unit (PSU), the first and the second connectors coupled to provide power to the motherboard;
   averaging the real-time voltage difference for a plurality of measurements;
   computing a resistance of the coupling between the first and the second connectors based at least on an averaged current from the PSU and the averaged real-time voltage difference, the resistance varying over time; and
   reporting the resistance of the coupling to the voltage measurement device; and
   measuring a real-time current of the PSU at the voltage measurement device based at least on the resistance of the coupling and the real-time voltage difference.

2. The method of claim 1, further comprising detecting a trip point comprising:
   receiving and retaining a trip point current at a trip point detector;
   receiving the real-time current at the trip point detector; and
   comparing the trip point current and the real-time current.

3. The method of claim 2, wherein the measuring, the calibrating, and the trip point detecting are controlled by a controller separate from a main processor of an information handling system.

4. The method of claim 3, further including:
   alerting the controller if the real-time voltage difference meets or exceeds the trip point voltage; and
   in response, the controller performing at least one of:
      asserting a PROCHOT signal;
      throttling the main processor;
      activating an alternate power supply; and
      notifying a user of the information handling system.

5. The method of claim 1, wherein the second measurement node is communicatively coupled to the voltage measurement device through a data connection between the PSU and the motherboard.

6. The method of claim 1, wherein the averaged current is sent to the calibrating device through the data connection between the PSU and the motherboard.

7. The method of claim 1, wherein the voltage measurement device is configured to measure the voltage difference at a frequency of between 0.1 and 100 microseconds.

8. The method of claim 1, wherein the voltage measurement device and the calibrating device are housed on the motherboard.

9. The method of claim 1, wherein the voltage measurement device and the calibrating device are housed on the PSU.

10. An information handling system, comprising:
   a motherboard comprising:
      a first connector for coupling to another connector; and
      a first measurement node positioned proximate the first connector on the motherboard;
   a power supply unit (PSU) comprising:
      a second connector coupled to and supplying power to the motherboard via the first connector, the coupling of the first and the second connectors having a resistance that varies over time; and
      a second measurement node positioned proximate the second connector on the PSU;
   a voltage measurement device configured to measure a real-time voltage difference between the first measurement node and the second measurement node and measure a real-time current of the PSU based at least on the real-time voltage difference between the first and the second measurement nodes and the resistance of the coupling; and
   a calibrating device configured to calibrate the voltage measurement device, the calibrating device configured to:

receive an averaged current from the PSU;

average the measured real-time voltage difference between the first and the second measurement nodes at a plurality of time increments;

compute the resistance of the coupling based at least on the averaged measured real-time voltage and the averaged current; and report the resistance of the coupling to the voltage measurement device.

11. The information handling system of claim 10, the voltage measurement device further comprising a trip point detector, configured to:

receive and retain a trip point current;

receive the real-time current; and compare the trip point current and the real-time current.

12. The information handling system of claim 11, wherein the voltage measurement device and the calibrating device are controlled by a controller separate from a main processor of the information handling system.

13. The information handling system of claim 12, wherein the trip point detector is further configured to alert the controller if the real-time voltage difference meets or exceeds the trip-point voltage, and in response, the controller is configured to do at least one of:

assert a PROCHOT signal;

throttle the main processor;

activate an alternate power supply; and notify a user of the information handling system.

14. The information handling system of claim 10, wherein the second measurement node is communicatively coupled to the voltage measurement device through a data connection between the PSU and the motherboard.

15. The information handling system of claim 14, wherein the averaged current is sent to the calibrating device through the data connection between the PSU and the motherboard.

16. The information handling system of claim 10, wherein the voltage measurement device is configured to measure the voltage difference at a frequency of between 0.1 and 100 microseconds.

17. The information handling system of claim 10, wherein the voltage measurement device and the calibrating device are housed on the motherboard.

18. The information handling system of claim 10, wherein the voltage measurement device and the calibrating device are housed on the PSU.

19. An information handling system, comprising:

a motherboard comprising:
   a first connector for coupling to another connector; and
   a first measurement node positioned proximate the first connector on the motherboard;

a power supply unit (PSU) comprising:
   a second connector coupled to and supplying power to the motherboard via the first connector, the coupling of the first and the second connectors having a resistance that varies over time; and
   a second measurement node positioned proximate the second connector on the PSU;

a voltage measurement device configured to measure a real-time voltage difference between the first measurement node and the second measurement node;

a trip point detector configured to:
   receive and retain a trip point voltage;
   receive the real-time voltage difference from the voltage measurement device;
   compare the trip point voltage to the real-time voltage difference; and
   generate a signal based on the real-time voltage difference exceeding the trip point voltage; and a calibrating device configured to generate the trip point voltage, the calibrating device configured to:
   receive an averaged current from the PSU;
   average the measured real-time voltage difference between the first and the second measurement nodes for a plurality of measurements;
   compute the resistance of the coupling based at least on the averaged measured real-time voltage and the averaged current; and
   update the trip point voltage based at least on the computed resistance of the coupling.

20. The information handling system of claim 19, wherein the voltage measurement device sends the real-time voltage difference to the trip point detector as an analog signal and sends the real-time voltage to the calibrating device via an analog to digital converter.

* * * * *